United States Patent
Graf et al.

(10) Patent No.: US 9,368,425 B2
(45) Date of Patent: Jun. 14, 2016

(54) EMBEDDED HEAT SPREADER WITH ELECTRICAL PROPERTIES

(71) Applicant: GLOBALFOUNDRIES Inc., Grand Cayman (KY)

(72) Inventors: Richard S. Graf, Gray, ME (US); Jay F. Leonard, Williston, VT (US); David J. West, Essex Junction, VT (US); Charles H. Wilson, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 55 days.

(21) Appl. No.: 14/135,991

(22) Filed: Dec. 20, 2013

(65) Prior Publication Data
US 2015/0179542 A1   Jun. 25, 2015

(51) Int. Cl.
  H01L 29/00    (2006.01)
  H01L 23/433   (2006.01)
  H01L 23/64    (2006.01)
  H01L 23/498   (2006.01)
  H01L 23/00    (2006.01)

(52) U.S. Cl.
  CPC .......... H01L 23/4334 (2013.01); H01L 23/645 (2013.01); *H01L 23/49816* (2013.01); *H01L 24/73* (2013.01); *H01L 2223/6677* (2013.01); *H01L 2224/32225* (2013.01); *H01L 2224/48091* (2013.01); *H01L 2224/48227* (2013.01); *H01L 2224/48235* (2013.01); *H01L 2224/49109* (2013.01); *H01L 2224/73215* (2013.01); *H01L 2224/73265* (2013.01); *H01L 2924/15311* (2013.01); *H01L 2924/19042* (2013.01); *H01L 2924/19104* (2013.01)

(58) Field of Classification Search
  CPC ......... H01L 43/12; H01L 43/02; H01L 43/08; H01L 51/5012; H01L 51/56
  USPC ........................ 257/531, 704, 706; 438/122
  See application file for complete search history.

(56) References Cited

U.S. PATENT DOCUMENTS

| | | | |
|---|---|---|---|
| 7,479,406 B1 | 1/2009 | Yamada et al. | |
| 2006/0113663 A1* | 6/2006 | Yuan .................... | H01L 23/4334 257/718 |
| 2007/0064398 A1* | 3/2007 | Lee et al. ....................... | 361/704 |
| 2007/0290322 A1* | 12/2007 | Zhao ..................... | H01L 23/367 257/690 |
| 2008/0024376 A1* | 1/2008 | Norris et al. ................... | 343/720 |
| 2009/0008793 A1 | 1/2009 | Pohl et al. | |
| 2010/0193935 A1 | 8/2010 | Lachner et al. | |
| 2010/0289133 A1 | 11/2010 | Chao et al. | |
| 2012/0267756 A1* | 10/2012 | Shi et al. ........................ | 257/531 |
| 2012/0306061 A1 | 12/2012 | Tabatabai et al. | |
| 2013/0015563 A1 | 1/2013 | Lee et al. | |
| 2013/0285233 A1* | 10/2013 | Bao et al. ....................... | 257/706 |

FOREIGN PATENT DOCUMENTS

| GB | 2466255 | 6/2010 |
|---|---|---|
| JP | 2011054600 | 3/2011 |

OTHER PUBLICATIONS

Edwards, Semiconductor and IC Package Thermal Metrics, SPRA953B, Jul. 2012.

* cited by examiner

*Primary Examiner* — Andy Huynh
(74) *Attorney, Agent, or Firm* — Yuanmin Cai; Andrew M. Calderon; Roberts, Mlotkowski, Safran & Cole PC (57) ABSTRACT

Embodiments of the invention relate to incorporating one or more antennas or inductor coils into a semi-conductor package. A heat spreader or metal sheet is embedded in the package and stamped or otherwise patterned into a spiral or serpentine form. The pattern enables the spreader to function as an inductor or antenna when connected to a semiconductor chip in communication with a printed circuit board.

20 Claims, 12 Drawing Sheets

EMBEDDED HEAT SPREADER WITH ELECTRICAL PROPERTIES

BACKGROUND

The invention relates to a semi-conductor package. More specifically, the invention relates to a semi-conductor package incorporating an antenna or inductor coil.

Circuit board designs utilize various arrangements in an effort to improve communication through an external antenna or inductor coil. It is known in the art to separately manufacture the semi-conductor package and the antenna, and to later mount both items on a substrate, such as a printed circuit board.

SUMMARY

The invention includes a package, method, and computer program product for a semi-conductor package incorporating an antenna or inductor coil.

A package, method, and computer program product are provided to incorporate an antenna or inductor coil into a semi-conductor package. The package includes a chip having two oppositely disposed surfaces. A first surface of the chip is in communication with a substrate. The package also includes a heat spreader that is vertically adjacent to the chip, and at the same time is electrically connected to the chip. A heat spreader is a heat exchanger that moves heat between a heat source, and a secondary heat exchanger whose surface area and geometry are more favorable than the source. Such a spreader is most often simply a plate made of copper, which has a high thermal conductivity. The heat spreader, hereinafter referred to as a spreader, has two oppositely disposed surfaces. A first surface of the spreader is in electrical communication with a second surface of the chip. A non-conductive compound seals both the chip and the spreader within an enclosure. In addition, a method and computer program product for assembling the package is provided.

Other features and advantages of this invention will become apparent from the following detailed description of the presently preferred embodiment(s) of the invention, taken in conjunction with the accompanying drawings.

BRIEF DESCRIPTION OF THE DRAWINGS

The drawings reference herein form a part of the specification. Features shown in the drawings are meant as illustrative of only some embodiments of the invention, and not of all embodiments of the invention unless otherwise explicitly indicated.

DETAILED DESCRIPTION

It will be readily understood that the components of the present invention, as generally described and illustrated in the Figures herein, may be arranged and designed in a wide variety of different configurations. Thus, the following detailed description of the embodiments of the apparatus, system, and method of the present invention, as presented in the Figures, is not intended to limit the scope of the invention, as claimed, but is merely representative of selected embodiments of the invention.

Reference throughout this specification to "a select embodiment," "one embodiment," or "an embodiment" means that a particular feature, structure, or characteristic described in connection with the embodiment is included in at least one embodiment of the present invention. Thus, appearances of the phrases "a select embodiment," "in one embodiment," or "in an embodiment" in various places throughout this specification are not necessarily referring to the same embodiment.

The illustrated embodiments of the invention will be best understood by reference to the drawings, wherein like parts are designated by like numerals throughout. The following description is intended only by way of example, and simply illustrates certain selected embodiments of devices, systems, and processes that are consistent with the invention as claimed herein.

Figure 1:
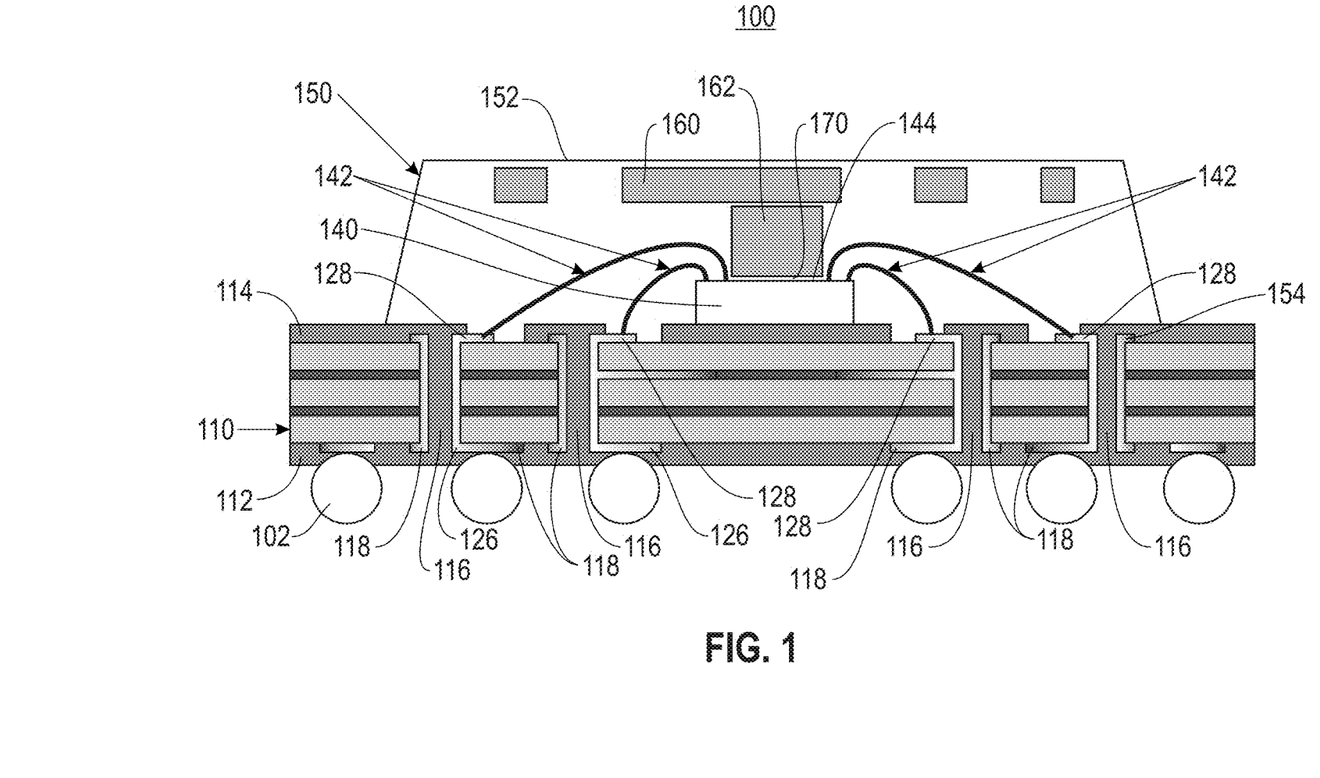
FIG. 1 depicts is a cross section of a semi-conductor package in accordance with the disclosure.

Wafer packages can be integrated with antenna structures that are coupled to a semi-conductor chip. A sealing structure is provided to enclose both the chip and the antenna to protect the chip and antenna from external impact and/or elements. FIG. 1 is a cross section (100) of a semi-conductor module in accordance with the invention. As shown, a substrate (110) is provided with two oppositely disposed surfaces, including a first surface (112) and a second surface (114). The first surface (112) is in communication with a ball grid array (102). In one embodiment, the substrate (110) is a multi-layer laminate board having a vertical interconnect access (VIA) (116) extending through the layers from the first surface (112) to the second surface (114). The ball grid array (102) is employed to mount the substrate (110) to a printed circuit board or motherboard.

The vias (116) are shown with a copper lining (118) and associated set of copper pads (126) and (128). The copper lining (118) extends through the interior length of the VIA. Copper pads (126) and (128) are an extension of the copper lining (118) along the first and second surfaces (112) and (114), respectively, of the substrate. In addition, the copper pads (126) are in communication with the ball grid array (102) and function to maintain electrical communication from the second surface (114) of the substrate (110) to the PCB or motherboard. A semi-conductor chip (140) is mounted to or in communication with the second surface (114) of the substrate (110). One or more electrical contacts (142) are shown extended between the chip (140) and the copper pads (128). Accordingly, electrical communication between the chip (140) and the printed circuit board (not shown) is maintained by the structure of the via (116), the electrical contacts (142), and the ball grid array (102).

A mold compound (150) is provided to enclose the chip (140) and a portion of the substrate (110). A spreader (160) is provided enclosed within the compound (150) and spaced apart from the chip (140), or in one embodiment the spreader (160) is provided in communication with a top wall of the compound (150). In one embodiment, and as shown herein, the spreader (160) is positioned adjacent to a second interior surface (152) of the mold compound, with the first interior surface (154) oppositely disposed and positioned adjacent to the substrate (110). As shown, the spreader (160) is vertically adjacent to the chip (140). Electrical contact between the spreader (160) and the chip (140) or the substrate (110) is provided by a conductive die attached paste or wirebonds. Accordingly, electrical connection between the spreader (160) and the chip (140) is provided.

In the embodiment shown in FIG. 1, the electrical contact is shown in the form of a paste (170). Specifically, the paste (170) interfaces with a second surface (144) of the chip (140). The spreader (160) is further shown with a stepped extension (162) that interfaces with the paste (170) to maintain the electrical connection. Specifically, only a select area, e.g. the stepped extension (162), of the spreader (160) maintains a direct interface with the chip (140).

The spreader (160) is configured with different patterns, with the patterns to provide electrical functionality. In one embodiment, the pattern is in the form of a spiral inductor for use as an antenna. Similarly, in one embodiment the pattern is in the form of a serpentine shape for use as a conductor. In one embodiment, other shapes may be employed for other purposes.

Figure 2:
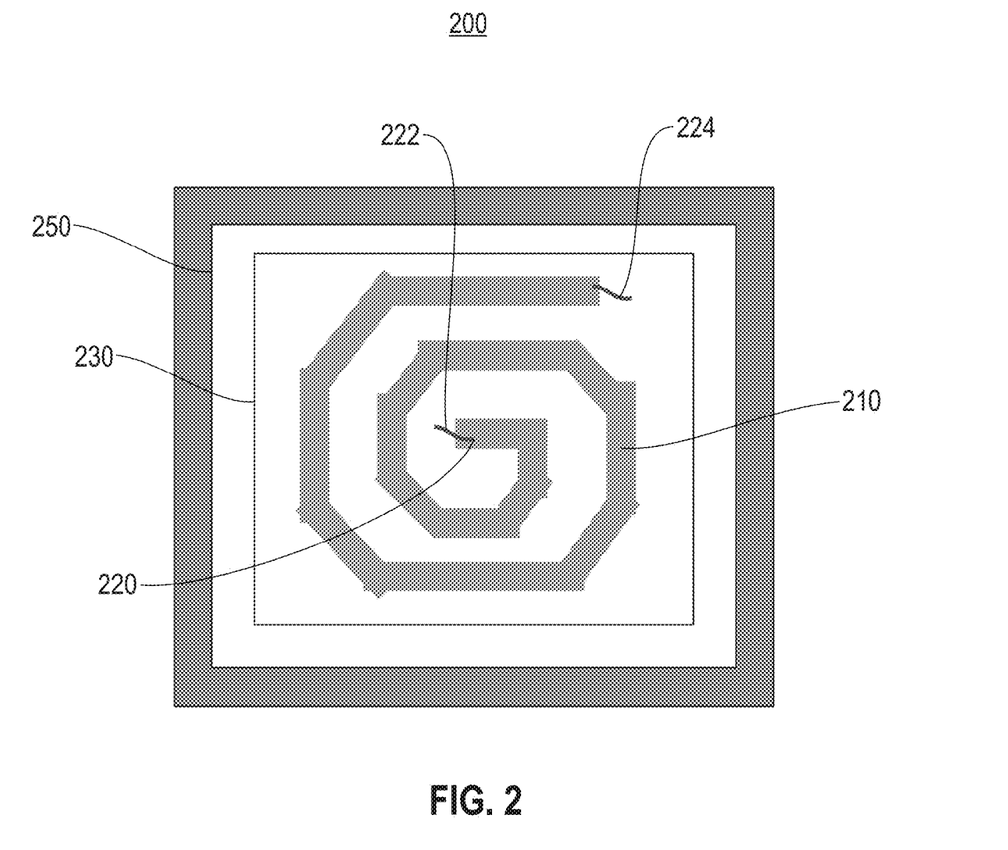
FIG. 2 depicts a top view of the module of FIG. 1 showing the shape of the spreader and arrangement of the spreader within the package.

FIG. 2 is a top view (200) of the module of FIG. 1 showing the shape of the spreader and arrangement of the spreader with respect to the package. As shown, the spreader (210) has a spiral pattern and forms an inductor coil. The spiral includes a continuous winding around an origin (220). In addition, the spreader (210) is shown positioned with respect to the chip (230) and the substrate (240). The chip (230) is shown having a greater surface area than the spreader (210). An electrical connection (222) is shown between the origin of the spreader (210) and the chip (230). In one embodiment, a second electrical connection (224) may be provided between the tail (226) of the spreader (210) and the chip (230). The mold compound (250) encloses both the chip (230) and the spreader (210) within an enclosure. Accordingly, the spreader (210) functions as an antennae structure for transmitting and/or receiving communication signals.

Figure 3:
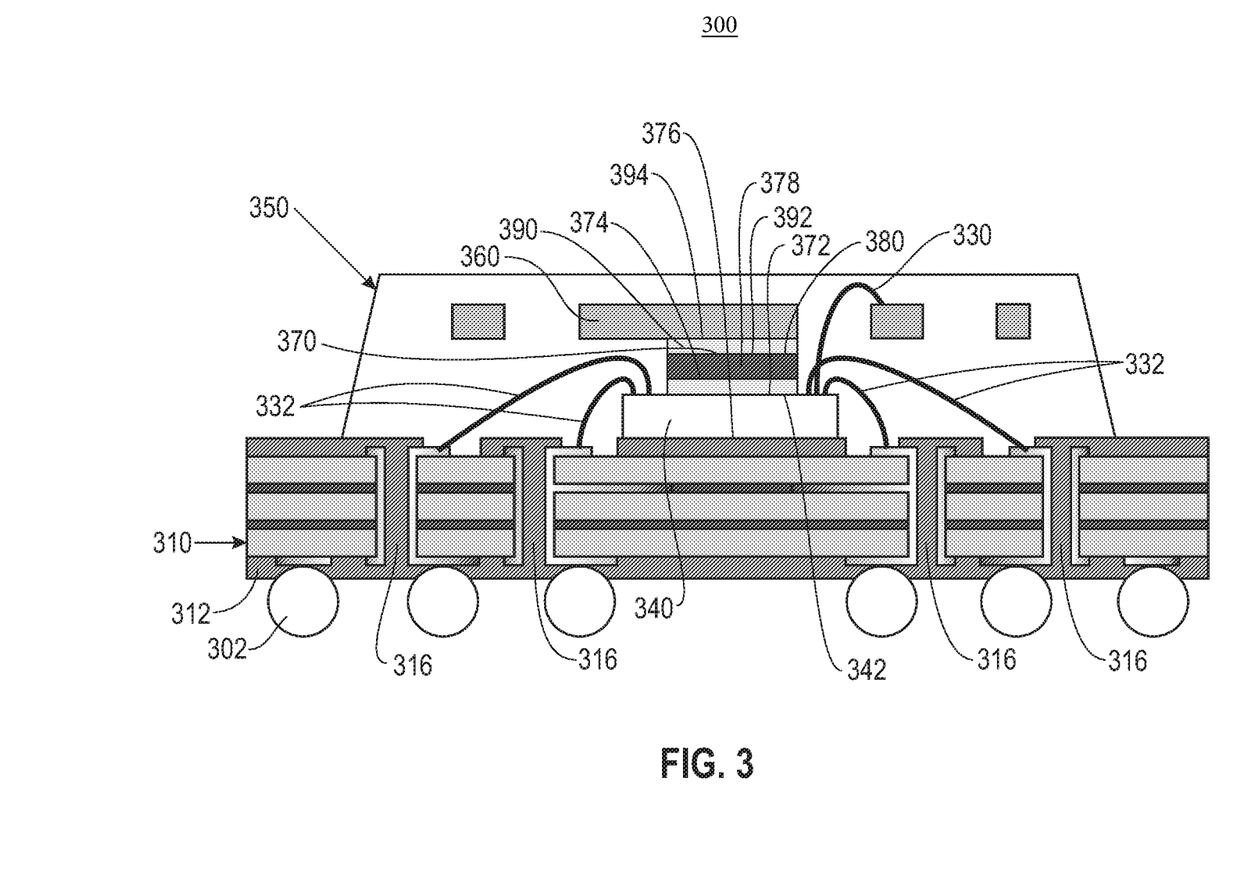
FIG. 3 depicts a cross section of a second embodiment of a semi-conductor package in accordance with the disclosure.

FIG. 3 is a cross section (300) of a second embodiment of a semi-conductor package in accordance with the invention. Similar to the module shown in FIG. 1, the multi-layer substrate (310) is shown with vias (316), a ball grid array (302) and a chip (340). In the embodiment shown herein a first non-conductive paste (370), or in one embodiment, a non-conductive film is provided on a select section of the second surface (342) of the chip (340). In one embodiment, the paste (370) or film does not cover the entire surface area of the second surface (342). A first surface (372) of the paste (370) is in communication with the second surface of the chip (342), and a second surface (374) of the paste (370) is in communication with a first surface (376) of a silicon interposer (378), or equivalent material to provided standoff. The interposer (378) includes a second surface (380) in communication with a second nonconductive paste (390), or in one embodiment, a non-conductive film. The second paste (390) is shown with a first surface (392) in communication with the silicon interposer (378) and a second surface (394) adjacently position to the spreader (360). As shown herein, the surface area of the portion of the spreader (360) that is adjacently position to the interposer (378) is greater than the surface area of the interposer (378). Furthermore, first electrical connection (330) is provided from the spreader (360) to the chip (340), and a second electrical connection (332) is provided form the chip (340) to the copper pads (318) in communication with the vias (316) and the second surface (312) of the substrate (310). Furthermore, a mold compound (350) encloses both the chip (340) and the heat slug (360) within an enclosure. Accordingly, The configuration shown herein reduces thermal abilities of the spreader (360) in exchange for electrical functionality of the antenna.

Figure 4:
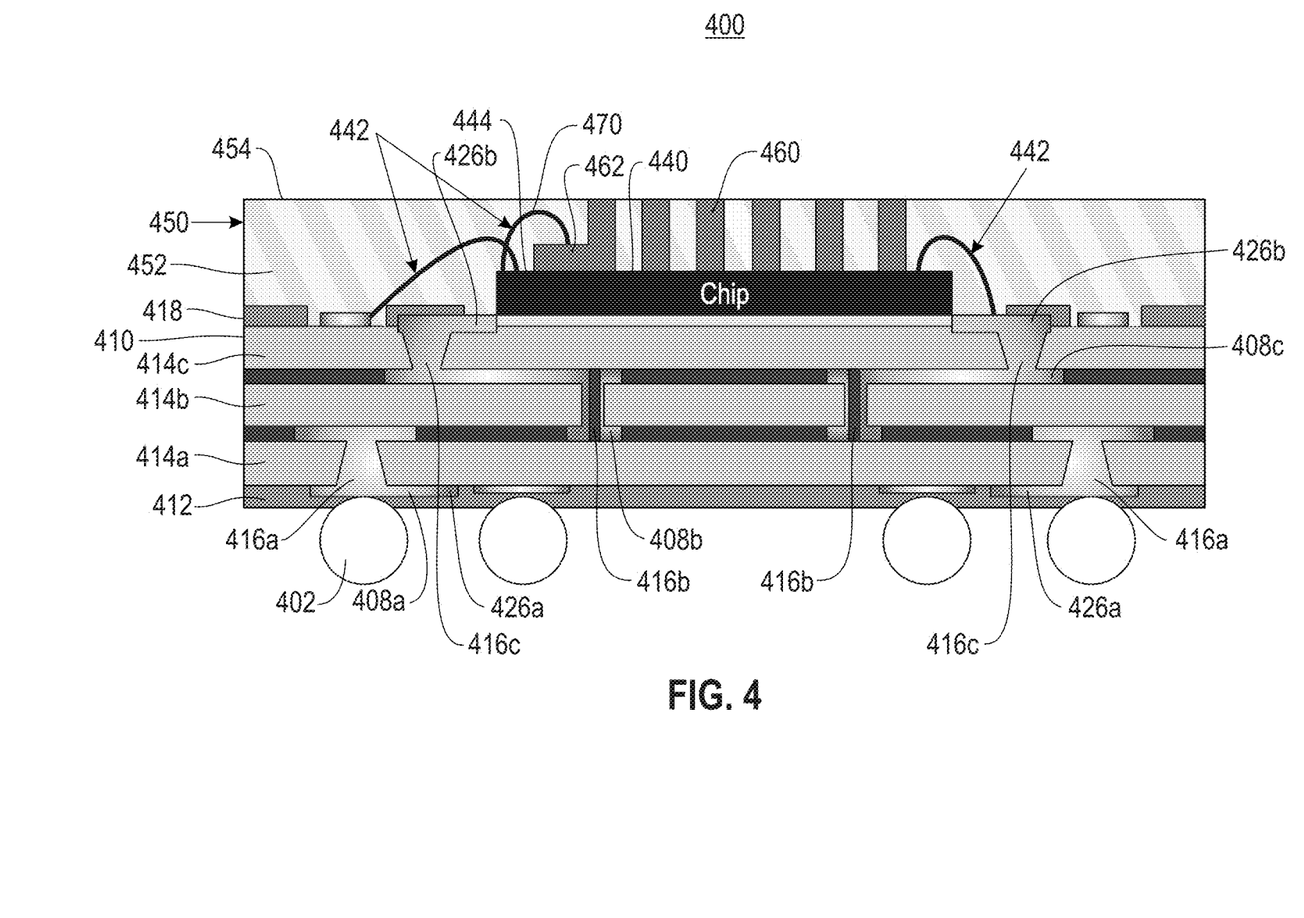
FIG. 4 depicts a cross section of a third embodiment of a semi-conductor package in accordance with the disclosure.

FIG. 4 is a cross section (400) of a third embodiment of a semi-conductor package in accordance with the invention. As shown, a substrate (410) is provided with two oppositely disposed surfaces, including a first surface (412) and a second surface (418). The first surface (412) is in communication with a ball grid array (402). In one embodiment, the substrate (410) is a multi-layer laminate board having a plurality of vias. As shown herein, the substrate has three layers (414a), (414b), and (414c). A first set of vias (416a) extend from the first surface (412) and through the first layer (414), a second set of vias (416b) extend through the second layer (414b), and a third set of vias (416b) extend through the third layer (414c) to the second surface (418) of the substrate (410). The ball grid array (402) is employed to mount the substrate (410) to a printed circuit board or motherboard.

The first, second, and third sets of vias (416a), (416b), and (416c), respectively, are shown with a copper lining (408a), (408b), and (408c), respectively. Copper pads (426a) are provided in communication with the first set of vias (416a) and the first surface (412) of the substrate (410), and copper pads (426b) are provided in communication with the third set of vias (416c) and the second surface (418) of the substrate (410). The copper pads are an extension of the copper lining along the first and second surfaces (412) and (418), respectively, of the substrate (410). In addition, the copper pads on the first surface (412) of the substrate (410) are in communication with the ball grid array (402) and function to maintain electrical communication from the second surface (418) of the substrate (410) to the PCB or motherboard.

A semi-conductor chip (440) is mounted to or in communication with the second surface (418) of the substrate (410). One or more electrical contacts (442) are shown extended between the chip (440) and the copper pads (426b). Accordingly, electrical communication between the chip (440) and the printed circuit board (not shown) is maintained by the structure of the vias (416a), (416b), and (416c), the electrical contacts (442), and the ball grid array (402).

A mold compound (450) is provided to enclose the chip (440), and in one embodiment a portion of the substrate (410). A spreader (460) is provided in communication within the compound (450) and spaced apart from the chip (440). In one embodiment, and as shown herein, the spreader (460) is positioned adjacent to a second interior section (452) of the mold compound and in communication with surface (454). As shown, the spreader (460) is vertically adjacent to the chip (440). Electrical contact between the spreader (460) and the chip (440) or the substrate (410) is provided by wirebond (470) which extends from the second surface (444) of the chip to one of the copper pads (426a). The electrical connections (470) and (442) are merely exemplary, and in one embodiment may vary, while maintaining electrical connection between the spreader (460) and the chip (440).

As shown in the cross sectional view, the spreader (460) has a height that extends from a surface (454) of the mold (450) to the second surface (444) of the chip (440). The select area (462) of the spreader (460) is shown in communication with the second surface (444) of the chip (440) as a stepped extension and does not extending through the height of the mold (450). The decreased height of the select area (462), e.g. stepped extension, reduces the length of the electrical connection to the second surface (444) of the chip (440). In one embodiment, another area of the spreader (460) may be provided with a decreased height to support wirebonding of one or more connection points. Accordingly, electrical connection between the spreader (460) and the chip (440) is provided along one or more connection points.

Figure 5:
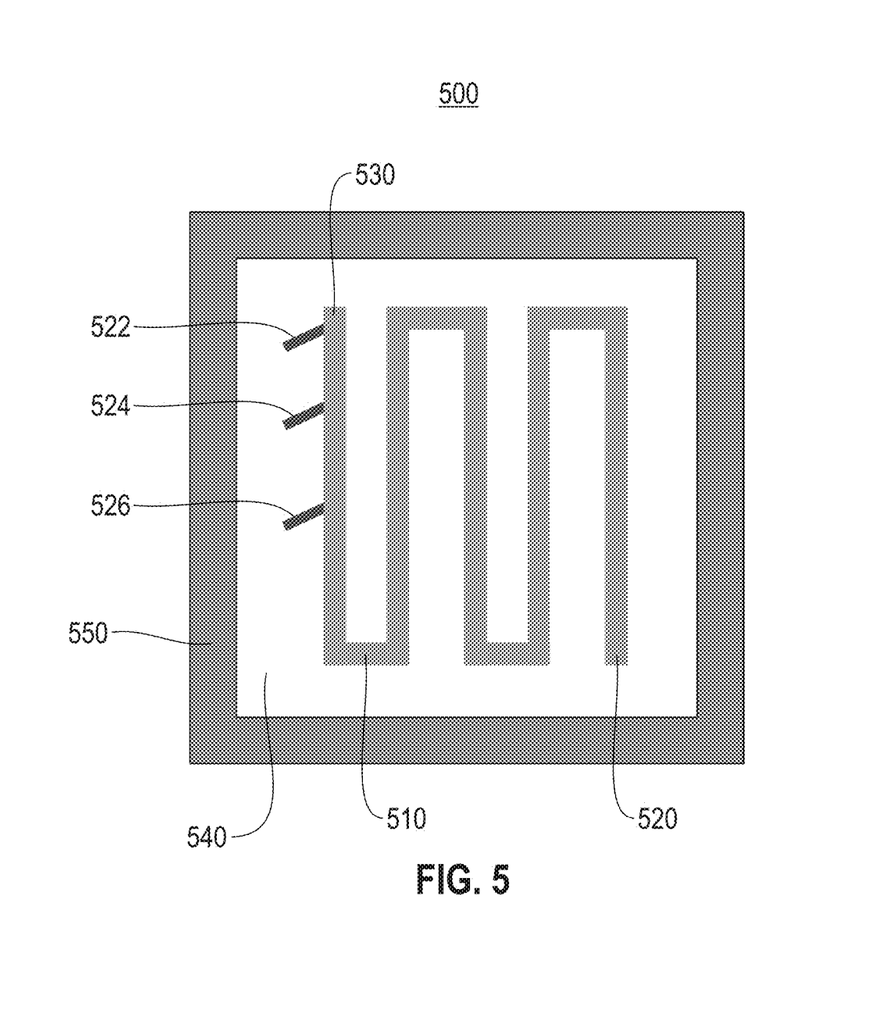
FIG. 5 depicts a top view of the module of FIG. 5 showing the shape of the spreader and arrangement of the spreader within the package.

FIG. 5 is a top view (500) of the module of FIG. 5 showing the shape of the spreader and arrangement of the spreader within the package. As shown, the spreader (510) has a serpentine pattern and forms an antenna to transmit power. The serpentine shape includes a continuous and longitudinal winding between two oppositely disposed end points (520) and (530). In addition, the spreader (510) is shown positioned within the mold (540) and the substrate (550). Electrical connections (522), (524), and (526) are shown adjacent to the second end point (530). Accordingly, the spreader (510) functions as an antennae structure for transmitting and/or receiving communication signals.

Figure 6:
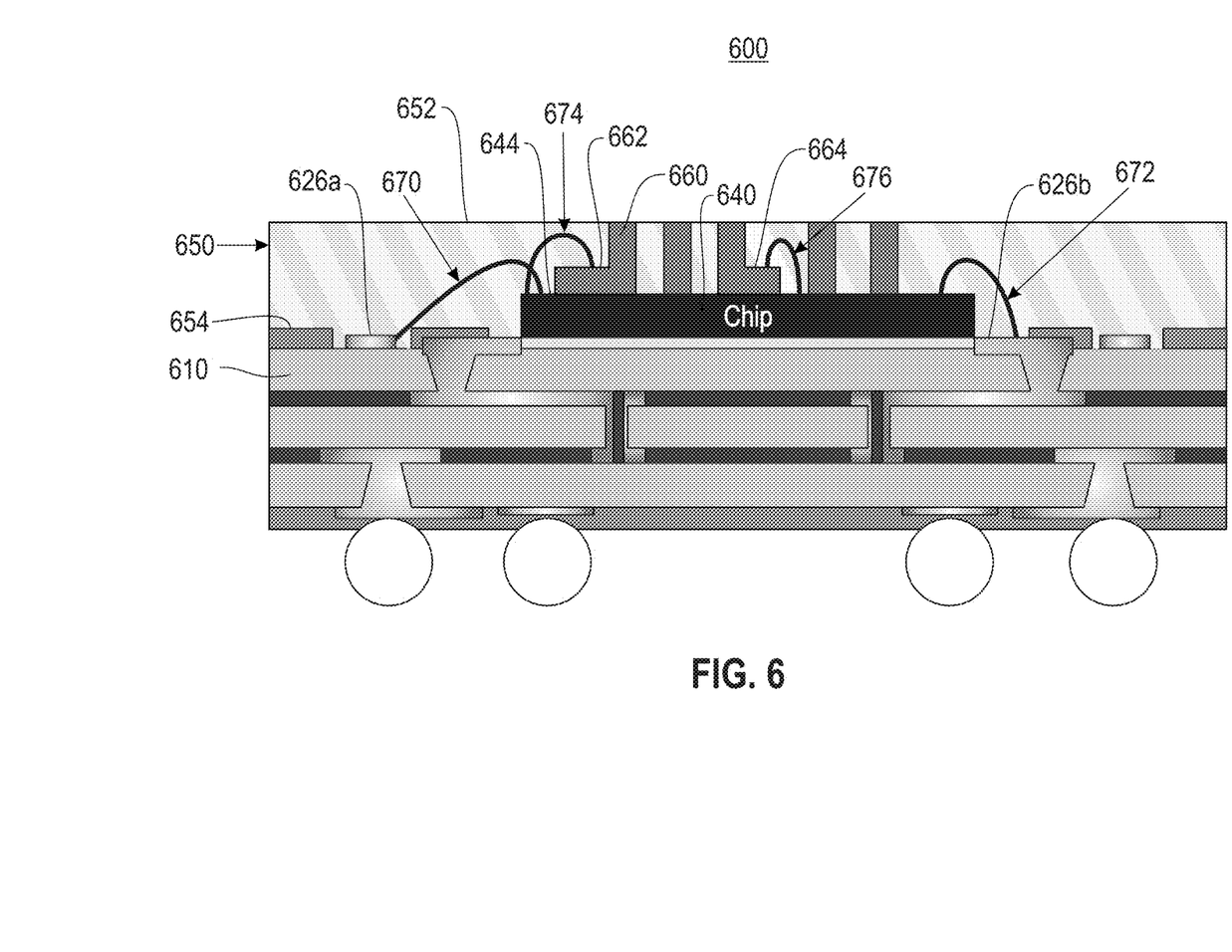
FIG. 6 depicts a cross section of a fourth embodiment of a semi-conductor package in accordance with the disclosure.

FIG. 6 is a cross section (600) of a fourth embodiment of a semi-conductor package in accordance with the invention. The structure of the substrate (610) is equivalent to the substrate (410) shown in FIG. 4. The difference between the embodiment in FIG. 4 and the embodiment shown herein is the structure of the spreader (660). As shown, the spreader (660) is provided enclosed within the compound (650) and spaced apart from the chip (640). In one embodiment, and as shown herein, the spreader (660) is positioned adjacent to a second interior surface (652) of the mold compound, with the first interior surface (654) oppositely disposed and positioned adjacent to the substrate (610). As shown, the spreader (660) is vertically adjacent to the chip (640). Electrical contact between the spreader (660) and the chip (640) or the substrate (610) is provided by wirebonds (670), (672), (674), and (676). A first wirebond (670) extends from the second surface (644) of the chip to one of the copper pads (626a), a second wirebond (672) extends from the second surface (644) of the chip to another copper pad (626b), a third wirebond (674) extends from a select area (662) of the spreader (660) to the second surface (644) of the chip (640), and the fourth wirebond (676) extends from a select area (664) of the spreader (660) to the second surface (644) of the chip (640). The electrical connections (670)-(676) are merely exemplary, and in one embodiment may vary, while maintaining electrical connection between the spreader (660) and the chip (640).

As shown in the cross sectional view, the spreader (660) has a height that extends from a surface (652) of the mold (650) to the second surface (644) of the chip (640). Two select areas (662) and (664) of the spreader (660) are shown in communication with the second surface (644) of the chip (640) in the form of stepped extensions that do not extend through the height of the mold (650). The decreased height of the select areas (662) and (664), e.g. stepped extension, reduces the length of the electrical connection to the second surface (644) of the chip (640). In one embodiment, another area of the spreader (660) may be provided with a stepped extension having decreased height to support wirebonding of one or more connection points. Accordingly, electrical connection between the spreader (660) and the chip (640) is provided along one or more connection points.

Figure 7:
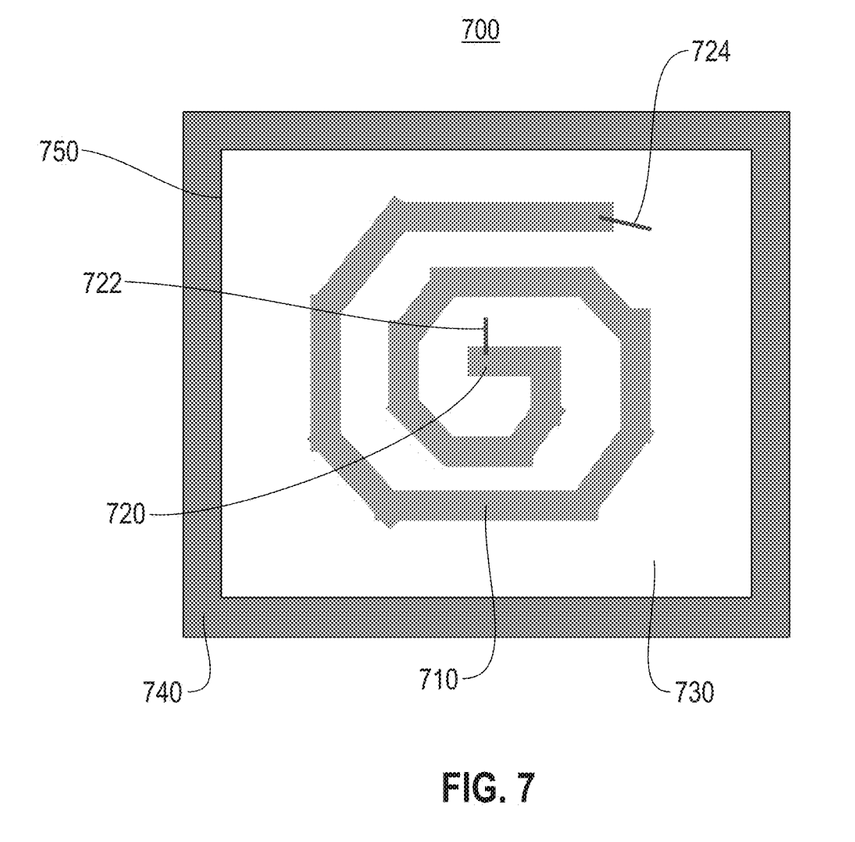
FIG. 7 depicts a top view of the module of FIG. 6 showing the shape of the spreader and arrangement of the spreader within the package.

FIG. 7 is a top view (700) of the module of FIG. 6 showing the shape of the spreader and arrangement of the spreader within the package. As shown, the spreader (710) has a spiral pattern and forms an inductor coil. The spiral includes a continuous winding around an origin (720). Two electrical connections (722) and (724) are shown between the spreader (710) and the chip (730). In one embodiment, electrical connection (722) is shown adjacent to the origin (720) and electrical connection (724) is shown adjacent to the tail (726). As shown in FIG. 6, the connections (722) and (724) have a decreased slug height to decrease the length of wiring required between the spreader (710) and the chip, and the length of the wiring required between the chip and the substrate (740). The mold compound (750) encloses both the chip and the spreader (710) within an enclosure. Accordingly, the spreader (710) functions as an antennae and an inductor for transmitting and/or receiving communication signals.

Figure 8:
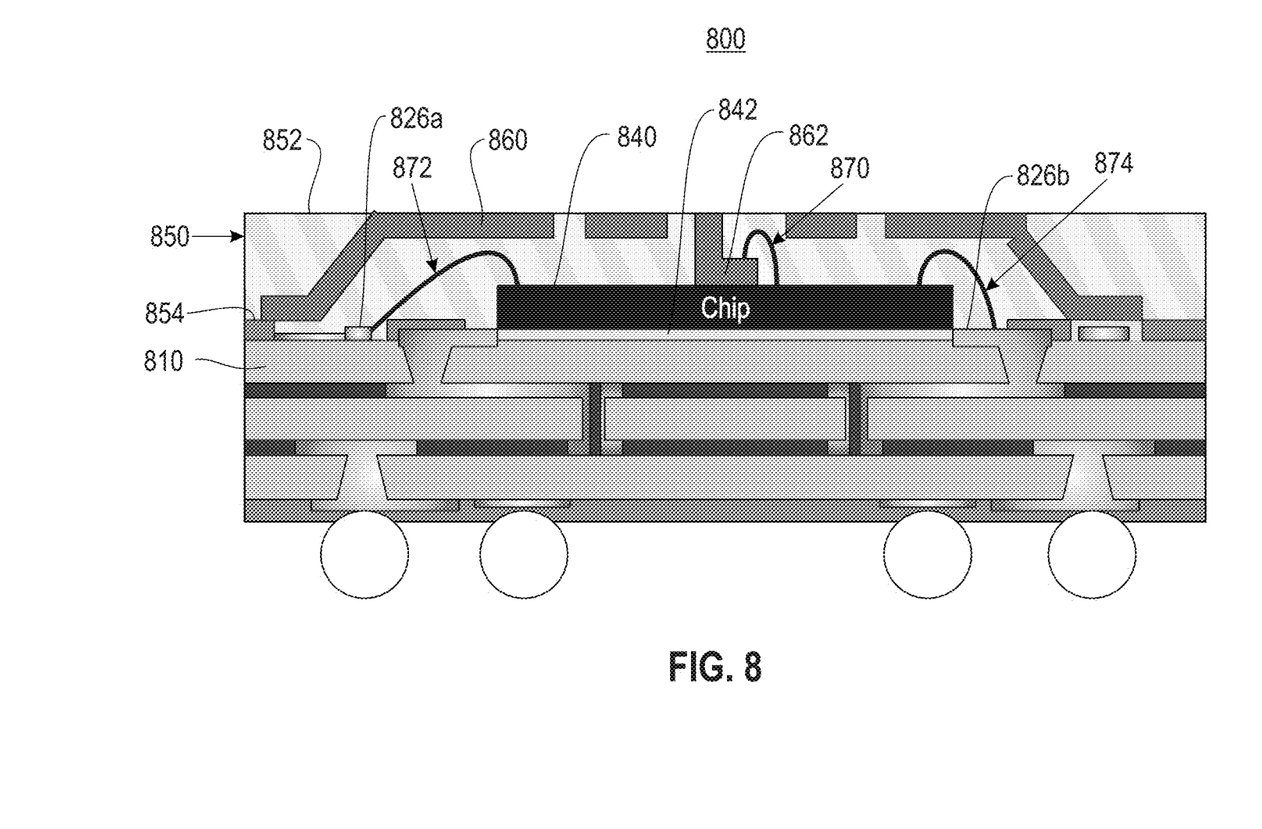
FIG. 8 depicts a cross section of a fifth embodiment of a semi-conductor package in accordance with the disclosure.

FIG. 8 is a cross section (800) of a fifth embodiment of a semi-conductor package in accordance with the invention. The structure of the substrate (810) is equivalent to the substrate (410) shown in FIG. 4. The difference between the embodiment in FIG. 4 and the embodiment shown herein is the structure of the spreader (860). As shown, the spreader (860) is provided enclosed within the compound (850) and partially spaced apart from the chip (840). In one embodiment, and as shown herein, the spreader (860) extends from a second interior surface (852) of the mold compound, with the first interior surface (854) oppositely disposed and positioned adjacent to the substrate (810). Electrical contact between the spreader (860) and the chip (840) or the substrate (810) is provided by a single wirebond (870). Furthermore, as shown, at the connection point via the wirebond (870), the portion of the spreader (860) that forms the connection is mounted adjacent to the second surface of the chip (840). In one embodiment, a secondary material such as a conductive paste (842) interfaces between the chip (840) and the substrate (810). Similarly, in one embodiment, the stepped portion (862) of the spreader (860) adjacent to the wirebond (870) has a length that is less than the distance to the interior surface (854). In one embodiment, a secondary material such as a conductive paste (not shown) interfaces between the substrate (810) and the spreader (860). Accordingly, as shown herein the size of the spreader (860) is not limited to the size of the chip (840) with a majority of the weight of the spreader (860) being on the substrate (810).

As shown in FIG. 8, one wirebond (870) extends from the spreader (860) directly to the chip (840). In addition, a second and third wirebond (872) and (874), respectively, extend from the second surface (844) of the chip to one of the copper pads (826a) and (826b), respectively. The electrical connections (870)-(874) are merely exemplary, and in one embodiment may vary, while maintaining electrical connection between the spreader (860) and the chip (840).

Figure 9:
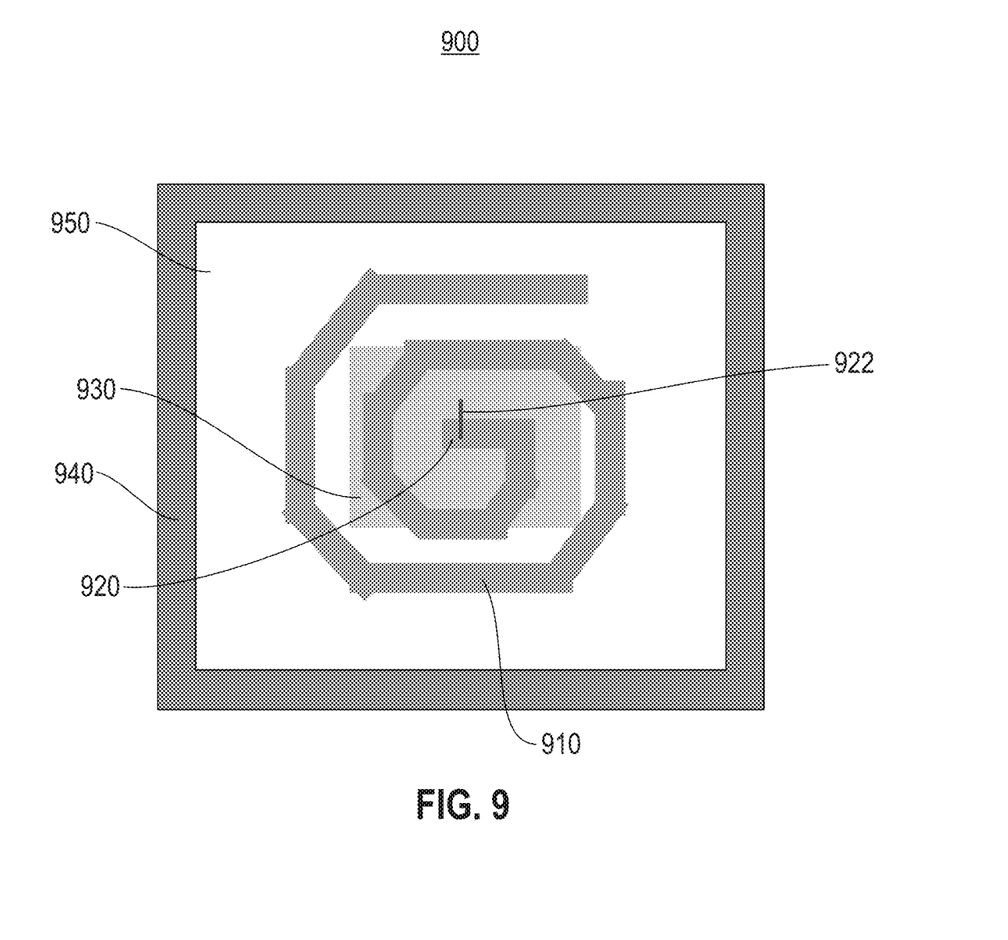
FIG. 9 depicts a top view of the module of FIG. 8 showing the shape of the spreader and arrangement of the spreader within the package.

FIG. 9 is a top view (900) of the module of FIG. 8 showing the shape of the spreader and arrangement of the spreader within the package. As shown, the spreader (910) has a spiral pattern and forms an inductor coil. The spiral includes a continuous winding around an origin (920). In addition, the spreader (910) is shown positioned with respect to the chip (930) and the substrate (940). The chip (930) is shown having a smaller surface area than the spreader (910). An electrical connection (922) is shown between the original of the spreader (910) and the chip (930). The mold compound (950) encloses both the chip (930) and the spreader (910) within an enclosure. Accordingly, the spreader (910) functions as an antennae structure for transmitting and/or receiving communication signals.

Figure 10:
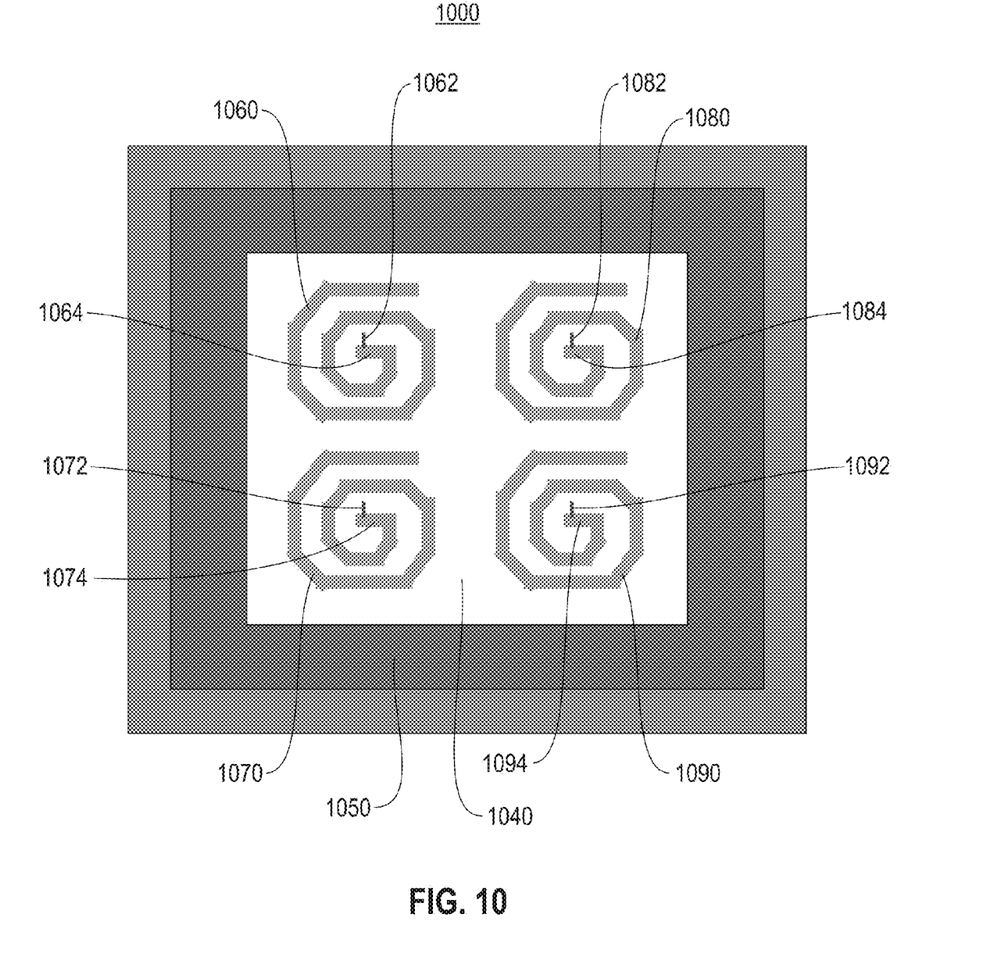
FIG. 10 depicts a top view of a plurality of spreaders within a single package, with the spreaders showing the spiral shape of FIG. 9.

Referring to FIG. 10, a top view (1000) of a plurality of spreaders within a single module are shown, with the spreaders showing the spiral shape of FIG. 9. More specifically, as shown in this example, there are four spreaders (1060), (1070), (1080), and (1090) in communication with a single chip (1040), contained within a single mold compound (1050), and mounted on a single substrate (1010). An electrical connection is shown between each spreader and the chip (1040). Specifically, connection (1062) is shown between spreader (1060) and chip (1040), connection (1072) is shown between spreader (1070) and chip (1040), connection (1082) is shown between spreader (1080) and chip (1040), and connection (1092) is shown between spreader (1090) and chip (1040). The mold compound (1050) encloses all four spreaders (1060), (1070), (1080), and (1090), within an enclosure. Furthermore, in the embodiment shown herein, the connection of each of the spreaders is adjacent to their respective origins (1064), (1074), (1084), and (1094). In one embodiment, additional connections or alternative locations for the connections may be provided, and as such the locations and quantity of connections shown in FIG. 10 should not be considered limiting.

Figure 11:
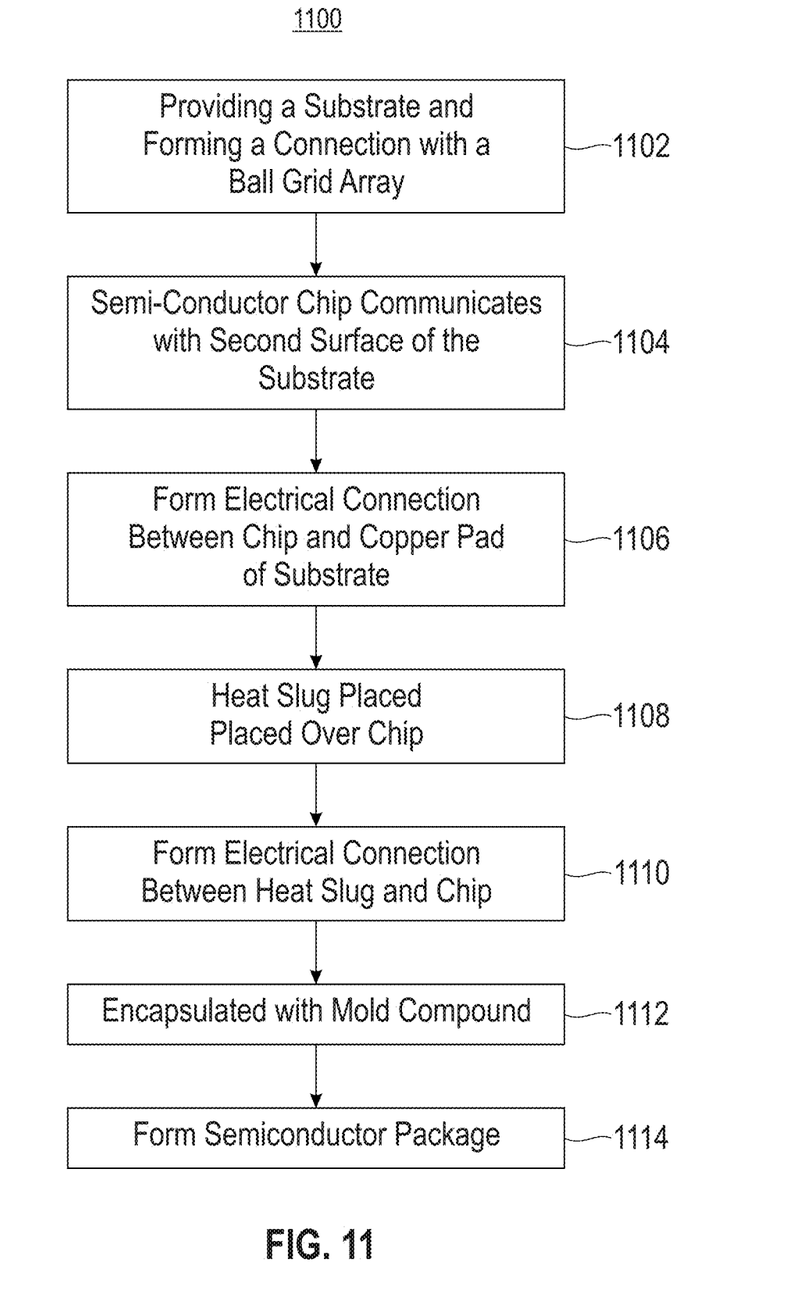
FIG. 11 depicts a flow chart illustrating a method of fabricating a semi-conductor package in accordance with an aspect of the disclosure.

As shown in FIGS. 1-5, the spreader functions as an antennae within a package. Specifically, the spreader incorporates one or more antennas or inductor coils into a semiconductor package. The spreader forms a pattern which can be used for electrical purposes when connected to the semi-conductor chip or the substrate. Referring to FIG. 11, a method is shown in accordance with some aspects of the invention. While this method is illustrated and described below as a series of acts or events, the present invention is not limited by the illustrated ordering of such acts or events. For example, some acts or events may occur in different orders or concurrently with other acts or events apart from those illustrated and/or described herein. In addition, not all of the illustrated acts or events may be required to implement a methodology in accordance with one or more aspects of the present invention. Furthermore, one or more of the acts or events depicted herein may be carried out in one or more separate acts or phases.

The method for fabricating the package (1100) starts with providing a substrate configured with vias extending through the substrate and forming a connection with a ball grid array (1102). A semi-conductor chip is provided in communication with the second surface of the substrate (1104), with the first surface of the substrate oppositely disposed and in communication with the ball grid array. At least one electrical connection is formed between the chip and a copper pad or alternate conducting material in communication with the second surface of the chip (1106). A spreader is placed over the chip spreader (1108), and an electrical connection is formed between the spreader and the second surface of the chip, and/or the spreader interfaces with the second surface of the chip (1110). The spreader has the patterned shape described in FIGS. 1-10. The spreader and chip are encapsulated with a mold compound (1112) and a semi-conductor package is formed (1114). Accordingly, the package formed incorporates one or more spreaders that function individually or together as an antenna or an inductor coil.

The method described in FIG. 11 may be implemented in programmable hardware device(s) such as field programmable gate arrays, programmable array logic, programmable logic devices, or the like. Tools to support the functionality of the method of fabricating the package may also be implemented in software for execution by various types of processors. An identified functional unit of executable code may, for instance, comprise one or more physical or logical blocks of computer instructions which may, for instance, be organized as an object, procedure, function, or other construct. Nevertheless, the executable of the tools need not be physically located together, but may comprise disparate instructions stored in different locations which, when joined logically together, comprise the tools and achieve the stated purpose of the tool.

Indeed, executable code could be a single instruction, or many instructions, and may even be distributed over several different code segments, among different applications, and across several memory devices. Similarly, operational data may be identified and illustrated herein within the tool, and may be embodied in any suitable form and organized within any suitable type of data structure. The operational data may be collected as a single data set, or may be distributed over different locations including over different storage devices, and may exist, at least partially, as electronic signals on a system or network.

Furthermore, the described features, structures, or characteristics may be combined in any suitable manner in one or more embodiments. In the following description, numerous specific details are provided, such as examples of agents, to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Figure 12:
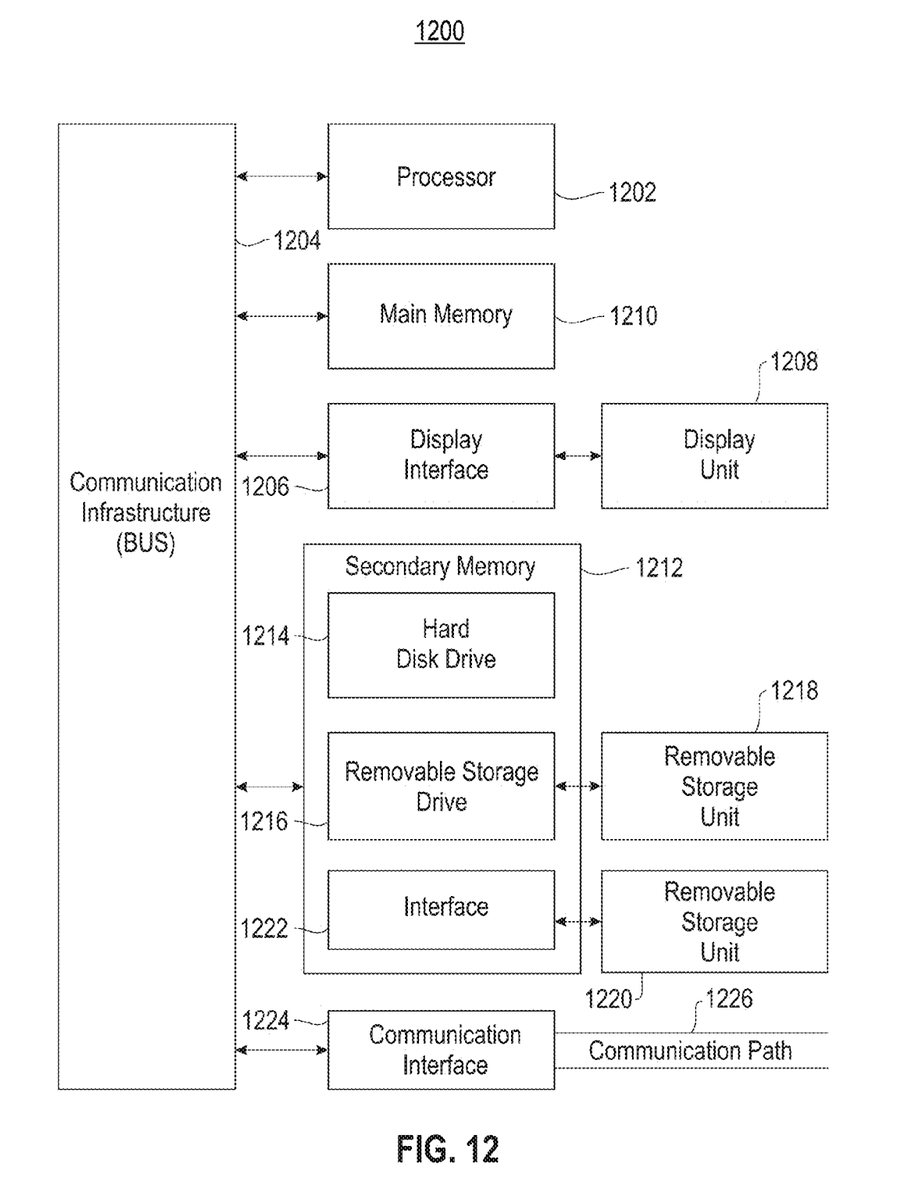
FIG. 12 depicts a block diagram of a computing environment according to an embodiment of the present disclosure.

Referring now to the block diagram of FIG. 12, additional details are now described with respect to implementing an embodiment of the present invention. The computer system includes one or more processors, such as a processor (1202). The processor (1202) is connected to a communication infrastructure (1204) (e.g., a communications bus, cross-over bar, or network).

The computer system can include a display interface (1206) that forwards graphics, text, and other data from the communication infrastructure (1204) (or from a frame buffer not shown) for display on a display unit (1208). The computer system also includes a main memory (1210), preferably random access memory (RAM), and may also include a secondary memory (1212). The secondary memory (1212) may include, for example, a hard disk drive (1214) and/or a removable storage drive (1216), representing, for example, a floppy disk drive, a magnetic tape drive, or an optical disk drive. The removable storage drive (1216) reads from and/or writes to a removable storage unit (1218) in a manner well known to those having ordinary skill in the art. Removable storage unit (1218) represents, for example, a floppy disk, a compact disc, a magnetic tape, or an optical disk, etc., which is read by and written to by removable storage drive (1216).

In alternative embodiments, the secondary memory (1212) may include other similar means for allowing computer programs or other instructions to be loaded into the computer system. Such means may include, for example, a removable storage unit (1220) and an interface (1222). Examples of such means may include a program package and package interface (such as that found in video game devices), a removable memory chip (such as an EPROM, or PROM) and associated socket, and other removable storage units (1220) and interfaces (1222) which allow software and data to be transferred from the removable storage unit (1220) to the computer system.

The computer system may also include a communications interface (1224). Communications interface (1224) allows software and data to be transferred between the computer system and external devices. Examples of communications interface (1224) may include a modem, a network interface (such as an Ethernet card), a communications port, or a PCM-CIA slot and card, etc. Software and data transferred via communications interface (1224) is in the form of signals which may be, for example, electronic, electromagnetic, optical, or other signals capable of being received by communications interface (1224). These signals are provided to communications interface (1224) via a communications path (i.e., channel) (1226). This communications path (1226) carries signals and may be implemented using wire or cable, fiber optics, a phone line, a cellular phone link, a radio frequency (RF) link, and/or other communication channels.

In this document, the terms "computer program medium," "computer usable medium," and "computer readable medium" are used to generally refer to media such as main memory (1210) and secondary memory (1212), removable storage drive (1216), and a hard disk installed in hard disk drive (1214).

Computer programs (also called computer control logic) are stored in main memory (1210) and/or secondary memory (1212). Computer programs may also be received via a communication interface (1224). Such computer programs, when run, enable the computer system to perform the features of the present invention as discussed herein. In particular, the computer programs, when run, enable the processor (1202) to perform the features of the computer system. Accordingly, such computer programs represent controllers of the computer system.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block(s).

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the Figures illustrate the architecture, functionality, and operation of possible implementations of systems, methods and computer program products according to various embodiments of the present invention. In this regard, each block in the flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, the spreader functions with respect to heat dissipation as well as induction or conduction based on the physical configuration of the spreader.

Alternative Embodiment

It will be appreciated that, although specific embodiments of the invention have been described herein for purposes of illustration, various modifications may be made without departing from the spirit and scope of the invention. Accordingly, the scope of protection of this invention is limited only by the following claims and their equivalents.

We claim:

1. A semiconductor package comprising:
   a semiconductor chip, the chip having a first surface and an oppositely disposed second surface, wherein the first surface of the chip is in communication with a substrate;
   a heat spreader disposed to be vertically adjacent to the chip and electrically connected thereto, the spreader having a first surface and an oppositely disposed second surface, wherein the spreader is electrically coupled with the chip, and wherein the spreader provides an electrical function through a pattern;
   a stepped extension positioned between the heat spreader and the chip, wherein only a select area of the stepped extension maintains a direct interface with the chip; and
   a non-conductive sealing compound having a first interior surface and an oppositely disposed second interior surface, wherein the chip and the spreader are enclosed within the compound, and the second surface of the spreader is adjacent to the second interior surface.

2. The package of claim 1, further comprising the spreader in direct physical contact with the chip.

3. The package of claim 1, further comprising the spreader in indirect physical contact with the chip, including a non-conductive material mounted adjacent to the second surface of the chip, wherein the first surface of the spreader is in direct physical contact with the material.

4. The package of claim 1, wherein the pattern is a spiral pattern forming an inductor coil, the spiral including a continuous winding around an origin.

5. The package of claim 4, further comprising the spreader in direct physical contact with the chip, wherein the direct physical contact consists of the origin.

6. The package of claim 4, further comprising the winding having a body having a first thickness and the origin having a second thickness, the first thickness being greater than the second thickness, and the second thickness having a wirebond connection with the chip.

7. The package of claim 1, further comprising the spreader having a surface area greater than the chip.

8. The package of claim 1, wherein the pattern is a serpentine pattern forming an antenna.

9. The package of claim 1, further comprising at least one additional heat spreader electrically coupled with the chip.

10. A method for fabricating a semiconductor package comprising:
    providing a semi-conductor chip having a first surface and an oppositely disposed second surface, wherein the first surface of the chip is in communication with a substrate;
    vertically disposing a heat spreader adjacent to the chip and electrically interfacing the spreader to the chip, the spreader having a first surface and an oppositely disposed second surface, wherein the spreader is electrically coupled with the chip, and wherein the spreader provides an electrical function;
    attaching a silicon interposer to the chip by a first non-conductive paste and to the spreader by a second non-conductive paste so that the silicon interposer is positioned between the chip and the spreader; and
    forming the package, including sealing the chip, the silicon interposer, and the spreader within an enclosure with a non-conductive sealing compound, wherein the compound has a first interior surface and an oppositely disposed second interior surface, and the second surface of the spreader is adjacent to the second interior surface.

11. The method of claim 10, further comprising patterning the spreader in a spiral form.

12. The method of claim 11, wherein the spiral pattern forms an inductor coil, and the spiral pattern including a continuous winding around an origin.

13. The method of claim 10, further comprising patterning the spreader in a serpentine pattern.

14. The method of claim 13, wherein the serpentine pattern forms an antenna.

15. The method of claim 10, wherein the spreader is exposed on a top side of the enclosure.

16. A semiconductor package comprising:
    a semiconductor chip, the chip having a first surface and an oppositely disposed second surface, wherein the first surface of the chip is in communication with a substrate;
    a heat spreader, the spreader having a first surface and an oppositely disposed second surface, wherein the spreader is electrically coupled with the chip, and wherein the spreader provides an electrical function;

an interposer, the interposer having a first surface covered with a first non-conductive paste that is in direct physical contact with the second surface of the chip and a second surface covered with a second non-conductive paste that is in direct physical contact with the first surface of the spreader, wherein the interposer provides for the electrical coupling between the spreader and the chip; and a non-conductive sealing compound, wherein the chip and the spreader are enclosed within the compound.

17. The package of claim 16, wherein the spreader has a spiral pattern forming an inductor coil, and the spiral includes a continuous winding around an origin.

18. The package of claim 16, wherein the spreader has a serpentine pattern, and the spreader provides a function as an antenna.

19. The package of claim 16, wherein the second surface of the spreader is co-planar with an interior surface of the compound.

20. The package of claim 16, wherein the interposer is made of a silicon material.

\* \* \* \* \*